United States Patent
Yoshida et al.

(12)
(10) Patent No.: US 6,300,249 B1
(45) Date of Patent: Oct. 9, 2001

(54) POLISHING COMPOUND AND A METHOD FOR POLISHING

(75) Inventors: Akitoshi Yoshida; Yoshihisa Ogawa, both of Chiba; Hiroaki Tanaka, Narashino, all of (JP)

(73) Assignee: SpeedFam Co Ltd, Kanagawa-pref (JP)

( * ) Notice: Subject to any disclaimer, the term of this patent is extended or adjusted under 35 U.S.C. 154(b) by 0 days.

(21) Appl. No.: 09/296,283

(22) Filed: Apr. 22, 1999

(30) Foreign Application Priority Data

Apr. 24, 1998 (JP) .................................................. 10-115290

(51) Int. Cl.$^7$ ......................... H01L 21/302; H01L 21/461
(52) U.S. Cl. ........................ 438/693; 252/79.1; 252/79.2; 51/306; 51/308; 51/309
(58) Field of Search .................................... 438/691, 692, 438/693; 216/88, 89; 427/215; 451/28; 252/79.2, 79.3, 79.4, 79.5; 51/308, 306, 307, 309

(56) References Cited

U.S. PATENT DOCUMENTS

| | | | |
|---|---|---|---|
| 4,057,939 | * | 11/1977 | Basi ........................................ 451/36 |
| 4,169,337 | * | 10/1979 | Payne ..................................... 451/41 |
| 5,391,258 | * | 2/1995 | Brancaleoni et al. ................. 216/89 |
| 5,709,588 | | 1/1998 | Muroyama . |
| 5,783,489 | * | 7/1998 | Kaufman et al. ..................... 438/692 |
| 5,866,031 | * | 2/1999 | Carpio et al. ........................ 252/79.1 |
| 5,922,091 | * | 7/1999 | Tsai et al. .............................. 51/306 |
| 6,027,669 | | 2/2000 | Miura . |

FOREIGN PATENT DOCUMENTS 0773270    5/1997    (EP) .
0846741    6/1998    (EP) .

\* cited by examiner

*Primary Examiner*—Benjamin L. Utech
*Assistant Examiner*—Duy-Vu Deo

(57) ABSTRACT

The present invention is a polishing compound comprising a colloidal solution containing 1~15 wt. % of silicon oxide particles of 8~500 nanometer average diameter, wherein said colloidal solution is prepared as a buffer solution which has buffering action between pH 8.7~10.6 by the addition of one combination selected from groups composed by weak acid and strong base, strong acid and weak base or weak acid and weak base, and logarithms of reciprocal number of acid dissociation constant at 25° C. of said weak acid and/or weak base is 8.0~12.0.

3 Claims, No Drawings

POLISHING COMPOUND AND A METHOD FOR POLISHING

DETAILED DESCRIPTION OF THE INVENTION

1. Field of the Invention

This invention relates to a polishing compound used for the surface polishing of the semiconductor substrate composed by a silicon wafer or a wafer of compound semiconductor, a method for preparation of said polishing compound and a polishing method by use of said polishing compound. More in detail relates to the polishing compound having buffer action and large electrical conductivity.

2. Description of the Prior Art

Usually, as the polishing compound which processes the surface of work-piece of semiconductor substrate such as a silicon wafer or a wafer of compound semiconductor (hereinafter shortened to wafers), a suspension in which fine particles of silicon oxide or hydrate of it are dispersed by colloidal state, so-called colloidal silica, is commonly used. At the actual polishing use, a work-piece is placed on the surface of a platen whose surface is tightly covered with a polishing pad composed of a foamed plastic or a suede type synthetic leather, and press the work-piece against the platen which is rotated by the constant speed and by the constant supply of the polishing compound. The term of polishing of this invention indicates a pre-polishing or a polishing process of wafers which are processed by a lapping process and then by an etching process to obtain a mirror finished surface, and a CMP (chemical-mechanical polishing) process of a device substrate.

For the pre-polishing process, a double sided polishing machine having an upper and a lower platen whose surface are covered by a thin layer of non-woven cloth is commonly used, meanwhile for the polishing process, a double sided polishing machine or a single sided polishing machine whose surfaces are covered by a thin layer of polishing pad composed of a foamed plastic or a suede type synthetic leather is commonly used. And, for the CMP process, a single sided polishing machine whose surface is covered by a thin layer of polishing pad composed by a slightly hard type foamed plastic is commonly used. At the actual use, the polishing is carried out by pressing the work-piece against the platen which rotates by constant speed, and providing the aqueous dispersion of polishing compound containing fine particles of silicon oxide.

As the polishing compound, the aqueous dispersion prepared by dispersing the fine particles of colloidal silica in an alkaline solution as disclosed in U.S. Pat. No. 3,328,141 is commonly used. The pre-polishing and polishing process are different from the previous process based on so-called mechanical processing which uses for instance a diamond grinding stone or hard abrasives of aluminum oxide. The feature of the pre-polishing and polishing process is to utilize the chemical effect of alkali to a silicon wafer, concretely utilize a corroding effect of alkali to a silicon wafer. That is, by the corroding effect of alkali, a thin soft corrosion layer is formed on the surface of a silicon wafer. The formed corrosion layer is removed by a mechanical action of fine particles of colloidal silica, thus the polishing is progressed. As mentioned above, since the polishing is progressed by the chemical action of alkaline component contained in the solution, it is necessary to maintain pH of the solution of polishing compound within the region bigger than 7. That is, when pH of the solution becomes closer to 7 which indicates the neutral region, the chemical action becomes weak and the removing rate falls down. Further, when pH of the solution becomes closed to 14 which indicates strong alkali region, the chemical action becomes strong and the removing rate is improved.

Therefore, in a case of this kind of polishing, the chemical and physical feature of the solution of polishing compound is very important. That is, the surface of the silicon wafer is corroded by an alkaline component and a thin corrosion layer is formed. The thickness and the hardness of the thin corrosion layer is largely effected by features of the solution of polishing compound. Since the electro chemical feature of the solution of polishing compound have strong influence to the thickness and the hardness, it is very important to keep pH of the solution in a stabilized region. If pH of the solution is easily affected by a change of external conditions such as heat, contact with outside air or contamination from outside, thickness of the layer, speed for corroding, consistency of the layer and removing speed of the layer fluctuate delicately, and it is difficult to expect a precise and a homogeneous polishing results, because. Further, since said corrosion layer is removed by the mechanical action of the particles of colloidal silicon oxide abrasives contained in polishing compound, it is necessary that these particleshave adequate diameter and not be easily broken or not to cohere and form gel. That is, particles of silicon oxide remove the corrosion layer formed by an alkaline component effectively by a mechanical action. Therefore, the polishing compound must not a compound which gives bad influence to the mirror finished surface after the corrosion layer is removed.

Up to the present, many kinds of compound are proposed as a polishing compounde of a silicone wafer. For instance, silica sol and silica gel are proposed as a polishing compound in U.S. Pat. No. 3,170,273. Further, the technique that the removing speed can be improved by adjusting pH of the colloidal solution within the range from 10.5 to 12.5 is disclosed in U.S. Pat. No. 3,328,141. In U.S. Pat. No. 4,169,337, the technique to add amines in a polishing compound is disclosed. In Japanese Patent Laid-Open Publication 2-158684, a polishing compound composed by water, colloidal silica, water soluble polymer of bibber than 100,000 molecular weight and water soluble salts is disclosed. Further, in Japanese Patent Laid-Open Publication 5-154760, a method for polishing by the use of a polishing compound containing 10~80 wt. % of piperazine which is a kind of water soluble amines to silica of silica gel or silica sol is disclosed. The important point of these disclosed methods is to improve the dispersing ability of a polishing compound and to improve the stability of polishing force by adding many kinds of additives to an alkaline base solution in which fine abrasives of colloidal silica or silica sol are dispersed, and is not to improve the removal speed of the conventional polishing compound.

Since a pre-polishing or a polishing process basically uses above mentioned polishing compound, the polishing speed is slow and productivity is not sufficient, further, since pH is changeable because it is easily affected by external conditions, polishing force lacks of stability. Namely, these pre-polishing or polishing processes can be said as a process which takes long time and as a troublesome process, and can not be said as a complete method. However, with advancement of integrated circuit and improvement of wafer diameter, a higher precise accuracy requirement for surface flatness of a silicon wafer or a substrate of semiconductor device is becoming important. Further, to improve the productivity, a polishing compound and a polishing method which accomplishes the higher removal speed are earnestly expected.

BRIEF SUMMARY OF THE INVENTION

The inventors of this invention have carried out an intensive study to overcome the above mentioned problems which conventional polishing compound has, and have found that the use of alkaline aqueous solution of colloidal silica containing fine particles of silicon oxide which has pH buffer action and have high electric conductivity as the solution of polishing compound, can accomplish the stabilized polishing of higher removal rate and have accomplished the present invention. The object of this invention is to provide a polishing compound having constant and stabilized pH value, higher removal speed and a feature which is stabilized at the recycling use, further to provide a method to prepare said polishing compound. And, the another object of this invention is to provide a polishing method of using said polishing compound.

The above mentioned object can be accomplished by a polishing compound comprising, colloidal solution containing 1~15% by weight (wt. %) of 8~500 nanometer average diameter silicon oxide particles, said colloidal solution is prepared as a buffer solution which has buffering action between pH 8.7~10.6 by adding one combination selected from groups composed by weak acid and strong base, strong acid and weak base or weak acid and weak base, wherein logarithms of reciprocal number of acid dissociation constant at 25° C. of said weak acid and/or weak base is 8.0~12.0. Further, it is possible to obtain a polishing compound which can accomplish the high removal speed keeping high quality surface by adjusting electric conductivity of polishing compound to the level bigger than 20 mS/m per 1 wt. % of silicon oxide. For example, this polishing compound can be prepared by diluting concentrated solution of 15~65 wt. % by water, organic solvent, solution containing salts or a mixture thereof at every actual use.

Further, the another object of this invention can be accomplished by a polishing method of a work by a polishing machine having two platens at upper and lower position or one platen whose surface is stuck with a polishing pad made by resin foam, synthetic leather or non-woven clothe and can rotate to the desired direction comprising, setting and pressing a work such as silicon wafer to said polishing machine, rotating at least one of said platens and work with a constant supply of said polishing compound.

DETAILED DESCRIPTION OF THE INVENTION

The average diameter of silicon oxide fine particles contained in a colloidal solution of this invention is 8~500 nanometer, desirably is 8~200 nanometer. These fine particles of silicon oxide can be flocculated particles. When the average diameter is smaller than 8 nanometer, the colloidal solution becomes to flocculate easily and the stability as a polishing compound is deteriorated. And when the average diameter is between 200 and 500 nanometer, although the properties as the polishing compound are not affected, the preparation of stabilized compound is difficult and is not profitable from the view point of price. Further, when the average diameter is bigger than 500 nanometer, the particle is beyond the colloid region and is not suited as the polishing compound.

The concentration of silicon oxide fine particles is necessary to be 1~15 wt. % and desirably 1~10 wt. % when it is used at the practical polishing. When the concentration is lower than 1 wt. %, polishing speed becomes very low and can not be practically used. On the contrary, the polishing speed is improved along with the increase of the concentration of silicon oxide and when the concentration reaches to about 15 wt. % level, the polishing speed reaches to the saturated point and does not improved any more beyond this point. Fine particles of silicon which generates as the polishing chips remain in the fluid of polishing compound, oxidized and becomes silicon oxide, which increase the concentration of silicon oxide of the solution. If the initial silicon oxide concentration of solution is high, since the silicon oxide concentration increases quickly during the polishing and consequently the recycled polishing solution is gelled quickly, the colloidal solution becomes unstable and the recycling use of the polishing compound is remarkably deteriorated, further is not profitable from the view point of price.

In this invention, it is necessary that pH of the polishing compound to in the region from 8.6 to 10.6. If it is lower than 8.6, the polishing speed becomes remarkably slow and is out of the practical use. And if pH becomes higher than 10.7, since colloid of silica has a tendency to flocculate and hurt the stability of polishing compound and also is out of practical use. Further, pH of the polishing compound must not be easily altered by the considerable change of the external condition such as friction, heat, contact with atmosphere and mixing with other composition. The important point of the present invention is to make a polishing compound as a solution which has a strong buffering effect to maintain pH within narrow region against the change of the external condition. In the present invention, it is desirable that the logarithm of inverse number (pKa) of acid dissociation constant (Ka) at 25° C. of weak acid and/or weak base is within the limits of 8.0~12.0. When pKa at 25° C. is smaller than 8.0, large quantity of weak acid and/or weak base is needed to increase pH of the solution. And when pKa at 25° C. is bigger than 12.0, it is difficult to prepare a buffer solution which has strong buffering effect to stabilize pH value within the limits of 8.7~10.6.

As an example of the weak acid to be used for the preparation of a polishing compound of this invention which has a buffering effect, boric acid (pKa=9.24), carbonic acid (pKa=6.35, 10.33), phosphoric acid (pKa=2.15, 7.20, 12.35), water soluble organic acid and mixture of these acids can be mentioned. As the weak base, water soluble amines and mixture of said amines can be mentioned. Concretely, ethylenediamine (pKa=7.08, 9.89), mono-ethanolamine (pKa=9.52), di-ethanol amine (pKa=8.90), triethylamine, ethylamine, diethylamine, 4-aminopyridine, piperazine (pKa=5.59, 9.71), piperidine (pKa=11.1), butylenediamine, propylenediamine, butylamine, hydroxyethylpiperazine, aminoethylpiperazine (pKa=4.02, 9.11, 9.80) and mixtures of these chemicals can be mentioned. As the strong base, a hydroxide of alkali metal and water soluble quaternary ammonium compound can be mentioned. Further, as the strong acid, hydrochloric acid, nitric acid and sulfuric acid can be used. In the above mentioned compounds, if plural pKa values are existent, it can be used when one of these values is within the limit.

To prepare the buffer solution, salts which is prepared by the combination of (1) weak acid and strong base, (2) strong acid and weak base and (3) weak acid and weak base can be added, or, can be added by the combination of salts and base or salts and acid. The buffer solution of this invention, is the solution prepared by above mentioned combination, in which weak acid and/or weak base is partially dissociated as an ion. That is, the dissociate state and undissociate state are coexists in the solution. The pH of the solution does not alter largely by adding of small amount of acid or base.

In the present invention, the polishing speed is remarkably improved by increasing the electric conductivity of polishing compound. The value of electric conductivity means easiness for electric current conducting through the solution, and corresponds to inverse number of the electric resistance per one unit length. And in the present invention, it is represented by electric conductivity per one unit length (micro·Siemens) converted to 1 wt. % of silicon oxide. In this invention, it is desirable that the electric conductivity is bigger than 20 mS/m/1%-$SiO_2$ for the improvement of polishing speed, and more desirable region is bigger than 25 mS/m/1%-$SiO_2$. As a method to increase the electric conductivity, following two methods can be mentioned. That is, one is a method to make the concentration of buffer solution higher and another one is a method to add salts.

The concentration of buffer solution can be made higher, by adding the combined solution of (1) weak acid and strong base, (2) strong acid and weak base or (3) weak acid and weak base without changing a molar ratio of acid and base.

Salts which is used as the method to add salts is composed by a combination of acid and base. As an acid, both strong acid and weak acid can be used, and mineral acid, organic acid and a mixture of them can be mentioned. As a base, both strong base and weak base can be used and concretely a hydroxide of alkali metal, water soluble quaternary ammonium compound and a mixture of them can be used.

When the combined solution of (1) weak acid and strong base, (2) strong acid and weak base or (3) weak acid and weak base is added, for the purpose to avoid the change of pH of the polishing compound, it is not desirable to add large quantity of the solution. Said two methods can be used together with.

To improve the physical property of the polishing compound of this invention, surfactant, dispersing agent or anti sedimentation agent can be used together with. As a surfactant, a dispersing agent and an anti sedimentation agent, water soluble organic composition or inorganic layered compound can be mentioned. Further, the polishing compound of this invention is an aqueous solution, however it is possible to add organic solvent. The polishing compound of this invention can be prepared at the each practical use by mixing colloidal silica, base, additives and water. And, in general, a polishing compound having 15~65% high concentration is prepared and at the each practical use, it is diluted by water or by a mixture of water and organic solvent.

DETAIL DESCRIPTION OF THE EXAMPLE

The polishing compound and the polishing method with use of said polishing compound of this invention will be understood more readily with reference to the Examples and the Comparative Examples, however these Examples are only intended to illustrate the invention and not be construed to limit the scope of the invention.

The polishing compound used in the Examples and the Comparative Examples are prepared by following procedure. As the colloidal silica, the product of 15 nm average diameter and 30 wt. % concentration which is on market is used. To 500 g of said colloidal silica, 1500 g of DI water is added and stirred, then acid, base and salts are added. Adjust to 3000 g by adding DI water, thus the solution of polishing compound to be used in the Examples is prepared. The silicon oxide concentration of this solution is 5 wt. %.

Polishing condition is illustrated as follows.

Polishing machine: SH-24 type single sided polishing machine (product of Speedfam Co., Ltd.)

Rotating speed of platen: 70 RPM

Rotating speed of pressure plate: 50 RPM

Polishing pad: SUBA400 (product of Rodel-Nitta Co., Ltd.)

Surface pressure: 400 $g/cm^2$

Flow rate of polishing compound: 80 mL/min

Polishing time: 10 minutes

Work-piece: 4 inch diameter silicon wafer (after etched)

pH of the polishing compound is measured by a pH meter which is adjusted by pH standard solutions of 6.86 and 9.18. Electric conductivity is measured by a electric conductivity meter. The polished surface is inspected by naked eye of an inspector and haze and pit are checked. And the polishing speed is calculated from the difference of work-piece weight between before polishing and after polishing.

EXAMPLE 1 AND COMPARATIVE EXAMPLE 1

In experiment number 1 and 2 of this Example, a solution of colloidal polishing compound is prepared based on above mentioned procedure, then tetramethylammoniumhydroxide (hereinafter shortened to TMAOH) and potassium hydrogen-carbonate ($KHCO_3$) are added by the recipe indicated in Table 1, thus the solutions of polishing compound of this invention are obtained. For the comparison, in experiment number 3, a solutions of polishing compound to which only TMAOH is added is prepared. And in experiment number 4, a silicon wafer polishing compound which is on the market is diluted by DI water so as the concentration of silicon oxide to be 5 wt. % is used as a solution of polishing compound. By the polishing method mentioned above, polishing experiments are carried out. In each experiment, the solution is circulated for 10 times and the polishing speed, pH and surface quality of work-piece are measured after each circulation. The experimental results are summarized in Table 1. As clearly understood from the results, in experiment numbers 1 and 2 which are the examples of this invention, the change of pH is comparatively slow and polishing speed is stable even if the polishing compound is circulated. On the contrary, in experiment numbers 3 and 4 which are the Comparative Example of this invention, the dropping down of pH value is remarkably big and accordingly the deterioration of polishing speed is also remarkably big. Meanwhile, the surface quality of the work-piece obtained from all experiment numbers are good.

TABLE 1

| | Example 1 | | Comparative Example 1 | |
|---|---|---|---|---|
| Experiment No. | 1 | 2 | 3 | 4 |
| additive/quantity (mol/Kg-$SiO_2$) | TMAOH/0.072 $KHCO_3$/0.079 | TMAOH/0.288 $KHCO_3$/0.302 | TMAOH/0.005 | Diluted polishing compound*** |
| pH | 10.0 | 10.3 | 10.4 | 10.4 |

TABLE 1-continued

| | | Example 1 | | Comparative Example 1 | |
|---|---|---|---|---|---|
| Experiment No. | | 1 | 2 | 3 | 4 |
| electric conductivity* | | 24 | 64 | 18 | 10 |
| experimental results | | polish speed** pH | polish speed** pH | polish speed** pH | polish speed** pH |
| circulation | 0 | 0.33 10.0 | 0.47 10.3 | 0.34 10.4 | 0.35 10.4 |
| number of | 1 | 0.34 9.9 | 0.47 10.1 | 0.33 9.9 | 0.34 10.0 |
| polishing | 2 | 0.35 9.8 | 0.49 10.1 | 0.33 9.7 | 0.34 9.8 |
| solution | 3 | 0.35 9.8 | 0.49 10.0 | 0.33 9.6 | 0.35 9.7 |
| | 4 | 0.35 9.7 | 0.48 10.0 | 0.32 9.5 | 0.35 9.6 |
| | 5 | 0.34 9.7 | 0.48 9.9 | 0.32 9.4 | 0.34 9.5 |
| | 6 | 0.35 9.7 | 0.48 9.9 | 0.31 9.3 | 0.34 9.4 |
| | 7 | 0.35 9.6 | 0.48 9.9 | 0.31 9.2 | 0.35 9.3 |
| | 8 | 0.35 9.6 | 0.48 9.9 | 0.30 9.1 | 0.32 9.3 |
| | 9 | 0.35 9.6 | 0.48 9.8 | 0.29 9.0 | 0.30 9.2 |
| | 10 | 0.34 9.5 | 0.48 9.8 | 0.29 9.0 | 0.29 9.1 |

\*mS/m/1%-SiO$_2$
\*\*Polishing speed $\mu$m/min
\*\*\*silicon wafer polishing compound on the market

EXAMPLE 2

TMAOH, potassium hydrogen-carbonate (KHCO$_3$), potassium sulfate (K$_2$SO$_4$), diaminobutane (DAB) and hydrochloric acid (HCl)) are added based on the combination and quantity shown in Table 2 to said colloidal solution of polishing compound, thus the polishing compounds of this invention are obtained. The polishing experiments of silicon wafer are carried out based on the above mentioned method. In the experiments of this Example, the recycling experiments are not carried out. Obtained results are summarized in Table 2.

TABLE 2

| Experiment No. | 5 | 6 | 7 | 8 | 9 | 10 | 11 | 12 |
|---|---|---|---|---|---|---|---|---|
| additive* TMAOH | 0.108 | 0.144 | 0.216 | 0.432 | 0.144 | 0.144 | | |
| DAB | | | | | | | 0.144 | 0.144 |
| KHCO$_3$ | 0.119 | 0.158 | 0.238 | 0.475 | 0.158 | 0.158 | | |
| K$_2$SO$_4$ | | | | | 0.144 | 0.288 | | |
| HCl | | | | | | | 0.097 | 0.072 |
| pH | 10.0 | 10.1 | 10.1 | 10.3 | 10.1 | 10.1 | 10.3 | 10.4 |
| Electric conductivity** | 35 | 40 | 53 | 92 | 70 | 101 | 26 | 25 |
| polishing speed ($\mu$m/min) | 0.37 | 0.40 | 0.43 | 0.47 | 0.44 | 0.46 | 0.42 | 0.42 |
| surface quality | good | good | good | good | good | good | good | good |

\*quantity; mol/Kg-SiO$_2$
\*\*mS/m/1%-SiO$_2$

COMPARATIVE EXAMPLE 2

Likely to Example 2, additives indicated by Table 3 are added and polishing compounds are prepared. The polishing compounds of experiment numbers 13 and 14 do not have a buffering effect and the electric conductivity is low, and in the experiment numbers 15 and 16 additives are not added by the combination of weak acid/strong base, strong acid/weak base or weak acid/weak base but by one component alone. In the experiment number 18, likely to the experiment 4, a silicon wafer polishing compound which is on the market is diluted by DI water so as the concentration of silicon oxide to be 5 wt. % is used as a solution of polishing compound. The polishing experiments of silicon wafer are carried out based on the above mentioned method. The obtained experimental results are summarized in Table 3.

TABLE 3

| Experiment No. | 13 | 14 | 15 | 16 | 17 | 18 |
|---|---|---|---|---|---|---|
| additive/ quantity (mol/Kg-SiO$_2$) | no | no | TMAOH/ 0.007 | K$_2$SO$_4$/ 0.144 | polishing compound on market no additive | NaOH is added to bring pH 10.9 |
| pH | 9.7 | 8.4 | 10.2 | 9.7 | 10.4 | 10.9 |

TABLE 3-continued

| Experiment No. | 13 | 14 | 15 | 16 | 17 | 18 |
|---|---|---|---|---|---|---|
| Electric conductivity* | 8 | 7 | 17 | 48 | 10 | gelated |
| polishing speed ($\mu$m/min) | 0.20 | 0.15 | 0.26 | 0.20 | 0.34 | can not polish |
| surface quality | good | good | good | good | good | |

\*mS/m/1%-SiO$_2$

It is clearly understood from the results shown in Table 2 and Table 3, the polishing compounds which are in the limit of this invention show good polishing speed. In the meanwhile, as shown in Comparative Example 2, the polishing compound whose pH value is adjusted but the buffering effect is not sufficient or the polishing compound whose electric conductivity is lower than 20 mS/m/1%-$SiO_2$, the polishing speed is not sufficient. Further, as shown in experiment number 18, the polishing compound whose electric conductivity alone is risen by adding salt does not have an effect to improve the polishing speed too.

EFFECT OF THE INVENTION

As illustrated above, the polishing compound of this invention contains silicon oxide particles of 8~500 nanometer average diameter and acid and base which forms buffering solution between pH 8.7~10.6 region, and the silica concentration at the actual use is adjusted to 1~15 wt. %. By making the polishing compound itself a buffering solution and by making the electric conductivity larger, the polishing compound whose pH change is small and has high polishing speed can be obtained. By the polishing compound of this invention, a silicon wafer and a wafer of device substrate of semiconductor can be polished constantly by high speed without deteriorating the surface quality.

What is claimed is:

1. A polishing compound consisting essentially of a colloidal solution containing 1 to 10 wt. % of silicon oxide particles of 8 to 200 nanometer average diameter, wherein said colloidal solution is prepared as a buffer solution which has buffering action between pH 9.5 to 10.6 by the addition of one combination comprising weak acid and strong base, strong acid and weak base or weak acid and weak base, and logarithms of reciprocal number of acid dissociation constant at 25° C. of said weak acid and/or weak base is 8.0 to 12.0, and wherein the electronic conductivity at 25° C. is larger than 20 mS/m per 1 wt. % of silicon oxide.

2. The polishing compound of claim 1 wherein the electronic conductivity at 25° C. is larger than 25 mS/m per 1 wt. % of silicon oxide.

3. The polishing compound of claim 1 comprising the combination of weak acid and strong base.

* * * * *